(12) United States Patent
De Boer et al.

(10) Patent No.: US 11,119,415 B2
(45) Date of Patent: Sep. 14, 2021

(54) METHOD OF DETERMINING A CHARACTERISTIC OF A STRUCTURE, AND METROLOGY APPARATUS

(71) Applicant: ASML Netherlands B.V., Veldhoven (NL)

(72) Inventors: Johannes Fitzgerald De Boer, Amstelveen (NL); Vasco Tomas Tenner, Amsterdam (NL); Arie Jeffrey Den Boef, Waalre (NL); Christos Messinis, Amsterdam (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/376,639

(22) Filed: Apr. 5, 2019

(65) Prior Publication Data

US 2019/0310559 A1 Oct. 10, 2019

(30) Foreign Application Priority Data

Apr. 9, 2018 (EP) ..................................... 18166312

(51) Int. Cl.
*G03F 7/20* (2006.01)
*G01N 21/88* (2006.01)

(52) U.S. Cl.
CPC ..... *G03F 7/70633* (2013.01); *G01N 21/8806* (2013.01); *G03F 7/70625* (2013.01); *G03F 7/70941* (2013.01)

(58) Field of Classification Search
None
See application file for complete search history.

(56) References Cited

U.S. PATENT DOCUMENTS

| 6,952,253 | B2 | 10/2005 | Lof et al. |
| 2006/0066855 | A1 | 3/2006 | Boef et al. |

(Continued)

FOREIGN PATENT DOCUMENTS

| EP | 3531191 A1 | 8/2019 |
| NL | 2010215 A | 10/2013 |

(Continued)

OTHER PUBLICATIONS

International Search Report and Written Opinion of the International Searching Authority directed to related International Patent Application No. PCT/EP2019/056776, dated Jun. 13, 2019; 13 pages.

*Primary Examiner* — Jack S Chen
(74) *Attorney, Agent, or Firm* — Sterne, Kessler, Goldstein & Fox P.L.L.C.

(57) ABSTRACT

Methods and apparatus are disclosed for determining a characteristic of a structure. In one arrangement, the structure is illuminated with first illumination radiation to generate first scattered radiation. A first interference pattern is formed by interference between a portion of the first scattered radiation reaching a sensor and first reference radiation. The structure is also illuminated with second illumination radiation from a different direction. A second interference pattern is formed using second reference radiation. The first and second interference patterns are used to determine the characteristic of the structure. Azimuthal angles of the first and second reference radiations onto the sensor are different.

17 Claims, 7 Drawing Sheets

(56) References Cited

U.S. PATENT DOCUMENTS

| | | | |
|---|---|---|---|
| 2007/0252986 A1 | 11/2007 | Sandstrom | |
| 2010/0328655 A1 | 12/2010 | Den Boef | |
| 2012/0206703 A1 | 8/2012 | Bhattacharyya et al. | |
| 2016/0061750 A1 | 3/2016 | Den Boef et al. | |
| 2016/0161864 A1 | 6/2016 | Middlebrooks et al. | |
| 2016/0231241 A1 | 8/2016 | Pandey | |
| 2017/0357155 A1 | 12/2017 | Quintanilha et al. | |
| 2019/0310559 A1* | 10/2019 | De Boer | G03F 7/70633 |

FOREIGN PATENT DOCUMENTS

| | | |
|---|---|---|
| WO | WO 2009/078708 A1 | 6/2009 |
| WO | WO 2016/030205 A1 | 3/2016 |
| WO | WO 2018/000036 A1 | 1/2018 |

\* cited by examiner

METHOD OF DETERMINING A CHARACTERISTIC OF A STRUCTURE, AND METROLOGY APPARATUS

FIELD

The present invention relates to determining a characteristic of a structure manufactured on a substrate.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC) in the design layout, or other methods generally defined as "resolution enhancement techniques" (RET). Alternatively, tight control loops for controlling a stability of the lithographic apparatus may be used to improve reproduction of the pattern at low k1.

During the manufacturing process there is a need to inspect the manufactured structures and/or to measure characteristics of the manufactured structures. Suitable inspection and metrology apparatuses are known in the art. One of the known metrology apparatuses is a scatterometer and, for example, a dark field scatterometer.

Patent application publication US2016/0161864A1, patent application publication US2010/0328655A1 and patent application publication US2006/0066855A1 discuss embodiments of a photolithographic apparatus and embodiments of a scatterometer. The cited documents are herein incorporated by reference.

SUMMARY

There is a need for improved metrology apparatuses for inspecting and/or measuring characteristics of structures on a substrate.

According to an aspect of the invention, there is provided a method of determining a characteristic of a structure manufactured on a substrate, comprising: illuminating the structure with first illumination radiation to generate first scattered radiation, and detecting on a sensor a first interference pattern formed by interference between a portion of the first scattered radiation reaching the sensor and first reference radiation; illuminating the structure with second illumination radiation, from a different direction to the first illumination radiation in a reference frame of the structure, to generate second scattered radiation, and detecting on the sensor a second interference pattern formed by interference between a portion of the second scattered radiation reaching the sensor and second reference radiation; and using the first interference pattern and the second interference pattern to determine the characteristic of the structure, wherein: an azimuthal angle of the first reference radiation onto the sensor is different to an azimuthal angle of the second reference radiation onto the sensor, in the reference frame of the structure.

The inventors have found that allowing the azimuthal directions of the first reference radiation and the second reference radiation to be different from each other allows contributions to differences between the first interference pattern and the second interference pattern that do not originate from the structure to be reduced.

In an embodiment, the difference between the azimuthal angle of the first reference radiation onto the sensor and the azimuthal angle of the second reference radiation onto the sensor is 180±30 degrees.

Choosing the difference in azimuthal angle to be close to 180 degrees in this manner is particularly effective for reducing unwanted contributions to differences between the first interference pattern and the second interference pattern.

In an embodiment, a radiation beam is split to generate the first illumination radiation and the first reference radiation; and an optical path length between a point where the radiation beam is split and the sensor is set to be equal for each of the first illumination radiation and the first reference radiation.

Setting the optical path lengths to be equal in this manner further reduces unwanted contributions to differences between the first interference pattern and the second interference pattern (e.g. contributions that do not originate from the structure).

In an embodiment, the azimuthal angle of the first reference radiation onto the sensor is oblique with respect to the azimuthal angle of the first illumination radiation onto the structure.

Allowing the difference to be an oblique angle provides freedom for reducing an unwanted variation of contrast with position in the first interference pattern. Reducing a variation of contrast with position facilitates formation of useful features (e.g. fringes) in the first interference pattern.

In an embodiment, the method comprises adjusting the direction of the first reference radiation onto the sensor relative to the direction of the first illumination radiation onto the structure to reduce a variation of contrast with position in the first interference pattern.

Performing this adjustment allows unwanted variation of contrast with position in the first interference pattern to be reduced.

In an embodiment, the method further comprises adjusting an optical property of an optical system used to guide the portion of the first scattered radiation reaching the sensor from the structure to the sensor to reduce the variation of contrast with position in the first interference pattern.

Performing this adjustment allows unwanted variation of contrast with position in the first interference pattern to be further reduced.

According to an alternative aspect, there is provided a method of determining a characteristic of a structure manufactured on a substrate, comprising: illuminating the structure with first illumination radiation to generate first scattered radiation, and detecting on a sensor a first interference pattern formed by interference between a portion of the first scattered radiation reaching the sensor and first reference radiation; illuminating the structure with second illumination radiation, from a different direction to the first illumination radiation in a reference frame of the structure, to generate second scattered radiation, and detecting on the sensor a second interference pattern formed by interference between a portion of the second scattered radiation reaching the sensor and second reference radiation; and using the first interference pattern and the second interference pattern to determine the characteristic of the structure, wherein: an azimuthal angle of the first reference radiation onto the sensor is nominally identical to an azimuthal angle of the second reference radiation onto the sensor and a difference between the azimuthal angle of the first reference radiation onto the sensor and each of an azimuthal angle of the first illumination radiation onto the structure and an azimuthal angle of the second illumination radiation onto the structure is 90±30 degrees, in the reference frame of the structure.

Arranging the relative directions of the first illumination radiation, first reference radiation, second illumination radiation and second reference radiation in this manner reduces unwanted differences (e.g. differences that do not originate from the structure) between the first interference pattern and the second interference pattern at least in a direction parallel to components of the first reference radiation and the second reference radiation in the plane of the first interference pattern and the second interference pattern. This is due to a variation of contrast with position having mirror symmetry with respect to the direction parallel to components of the first reference radiation and the second reference radiation in the plane of the first interference pattern and the second interference pattern.

According to an aspect of the invention, there is provided a metrology apparatus configured to determine a characteristic of a structure manufactured on a substrate, comprising: an illumination branch configured to illuminate the structure with first illumination radiation to generate first scattered radiation, a detection branch configured to detect on a sensor a first interference pattern formed by interference between a portion of the first scattered radiation reaching the sensor and first reference radiation, wherein: the illumination branch is further configured to illuminate the structure with second illumination radiation, from a different direction to the first illumination radiation in a reference frame of the structure, to generate second scattered radiation, the detection branch is further configured to detect on the sensor a second interference pattern formed by interference between a portion of the second scattered radiation reaching the sensor and second reference radiation; the apparatus further comprises a processing unit configured to use the first interference pattern and the second interference pattern to determine the characteristic of the structure; and an azimuthal angle of the first reference radiation onto the sensor is different to an azimuthal angle of the second reference radiation onto the sensor, in the reference frame of the structure.

According to an aspect of the invention, there is provided a metrology apparatus configured to determine a characteristic of a structure manufactured on a substrate, comprising: an illumination branch configured to illuminate the structure with first illumination radiation to generate first scattered radiation, a detection branch configured to detect on a sensor a first interference pattern formed by interference between a portion of the first scattered radiation reaching the sensor and first reference radiation, wherein: the illumination branch is further configured to illuminate the structure with second illumination radiation, from a different direction to the first illumination radiation in a reference frame of the structure, to generate second scattered radiation, the detection branch is further configured to detect on the sensor a second interference pattern formed by interference between a portion of the second scattered radiation reaching the sensor and second reference radiation; the apparatus further comprises a processing unit configured to use the first interference pattern and the second interference pattern to determine the characteristic of the structure; and an azimuthal angle of the first reference radiation onto the sensor is different to an azimuthal angle of the second reference radiation onto the sensor, in the reference frame of the structure.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
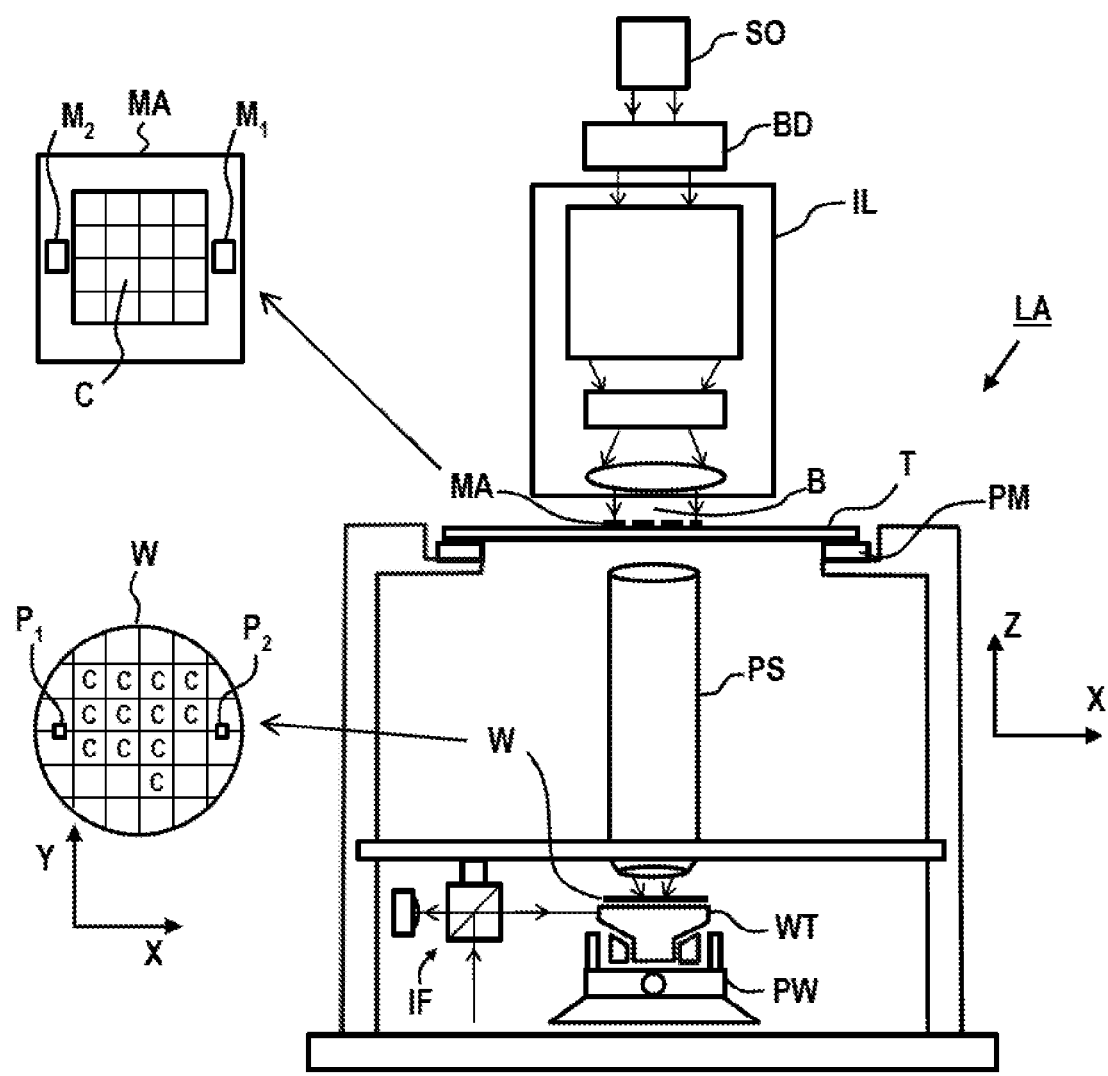
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
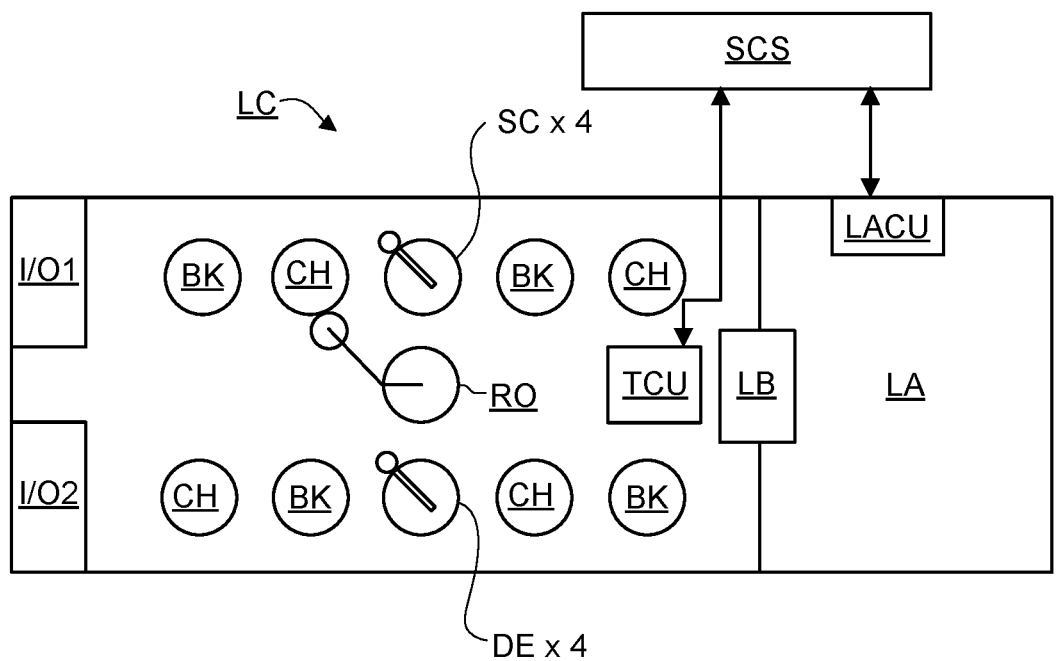
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An apparatus may be provided for determining properties of the substrates W, and in particular, how properties of different substrates W vary or how properties associated with different layers of the same substrate W vary from layer to layer. The apparatus may be referred to as an inspection apparatus or a metrology apparatus depending on the nature of the properties being measured. Where the apparatus provides a binary check (e.g. determining whether a defect is present or not), the apparatus is typically but not exclusively referred to as an inspection apparatus. Where the apparatus makes a quantitative measurement of a parameter such as overlay (e.g. such that the output from the apparatus is a measured value with a unit, such as nanometers), the apparatus is typically but not exclusively referred to as a metrology apparatus. The apparatus, whether an inspection apparatus or metrology apparatus, may be part of the lithocell LC, or may be integrated into the lithographic apparatus LA, or may even be a stand-alone device. The apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
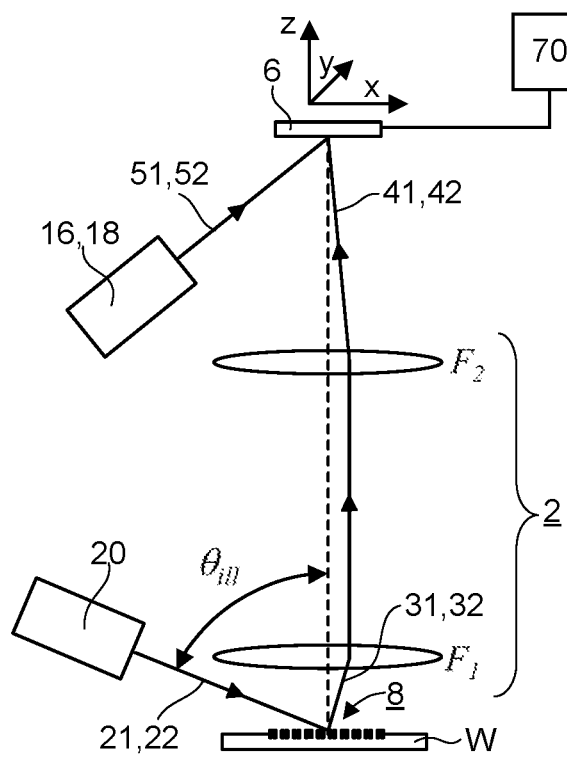
FIG. 3 depicts a schematic representation of a metrology apparatus.

FIG. 3 depicts a metrology apparatus suitable for determining a characteristic of a structure 8 (e.g. overlay) manufactured on a substrate W according to embodiments of the disclosure.

In an embodiment, the metrology apparatus comprises an illumination branch configured to illuminate the structure 8 with first illumination radiation 21. The illumination by the first illumination radiation 21 generates first scattered radiation 31. The metrology apparatus comprises a detection branch. The detection branch comprises an optical system 2 for guiding a portion 41 of the first scattered radiation 31 from the structure 8 to a sensor 6. The portion 41 of the first scattered radiation 31 is thus the portion of the first scattered radiation 31 that reaches the sensor 6. Other portions of the first scattered radiation 41 do not reach the sensor 6. In an embodiment, the portion 41 of the first scattered radiation 31 reaching the sensor 6 excludes a specular reflection component of the first scattered radiation 31. This may be achieved by arranging for a polar angle of incidence of the first illumination radiation 21 to be large enough to ensure that the specular reflection, which will occur at the same polar angle of incidence as the illumination, falls outside of a numerical aperture (NA) of the optical system 2. The sensor 6 thus makes a dark field measurement. In an embodiment, the portion 41 of the first scattered radiation 31 consists at least predominantly of (i.e. more than half of or completely of) one or more non-zeroth order diffraction components, for example a +1 order diffraction component only or one or more of a +1, +2, +3 or higher order positive non-zeroth order diffraction component, scattered from the structure 8.

The sensor 6 is capable of recording a spatial variation of radiation intensity. The sensor 6 may comprise a pixelated image sensor such as a CCD or CMOS. In an embodiment, a filter is provided that filters radiation impinging on the sensor 6. In an embodiment, the filter is a polarizing filter. In an embodiment, the sensor 6 is positioned in an image plane (which may also be referred to as a field plane) of the optical system 2. The sensor 6 thus records a spatial variation of radiation intensity in the image plane (field plane). In other embodiments, the sensor 6 is positioned in a pupil plane of the optical system 2, in a plane conjugate with the pupil plane of the optical system 2, or in a plane between the pupil plane and the image plane.

In an embodiment, the optical system 2 has a low NA, defined as the NA being lower than 0.3, optionally lower than 0.2. In an embodiment, the optical system 2 comprises a planoconvex lens. The planoconvex lens is isoplanatic and has relatively high aberrations. In an embodiment, the optical system 2 comprises a planoasphere lens or a bi-asphere lens. The planoasphere is non-isoplanatic and has relatively low aberrations. In an embodiment, the optical system 2 comprises mirror optics. In an embodiment, the optical system 2 has a high NA defined as the NA being higher than 0.5, optionally higher than 0.65, optionally higher than 0.8.

In an embodiment, the detection branch further directs first reference radiation 51 onto the sensor 6 at the same time as the portion 41 of the first scattered radiation 31. In an embodiment, the first reference radiation 51 comprises a plane wave or a spherical wave. A first interference pattern is formed by interference between the portion 41 of the first scattered radiation 31 reaching the sensor 6 and the first reference radiation 51. The portion 41 of the first scattered radiation 31 reaching the sensor 8 is at least sufficiently coherent at the sensor 8 with the first reference radiation 51 for the first interference pattern to be formed and for the first interference pattern to be detectable by the sensor 6. The first interference pattern is recorded by the sensor 6.

At a subsequent time, the structure 8 is illuminated with second illumination radiation 22. The second illumination radiation 22 is incident on the structure 8 from a different direction to the first illumination radiation 22 in the reference frame of the structure 8. The difference in direction may be implemented by changing the direction of illumination in the reference frame of the optical system 2, by rotating the substrate W (e.g. by 180 degrees), or by a combination of changing the direction of illumination in the reference frame of the optical system 2 and rotating the substrate W. The illumination by the second illumination radiation 22 generates second scattered radiation 32. The optical system 2 guides a portion 42 of the second scattered radiation 32 from the structure 8 to the sensor 6. The portion 42 of the second scattered radiation 32 is thus the portion of the second scattered radiation 32 that reaches the sensor 6. Other portions of the second scattered radiation 32 do not reach the sensor 6. In an embodiment, the portion 42 of the second scattered radiation 32 reaching the sensor 6 excludes a specular reflection component of the second scattered radiation 32. The sensor 6 thus makes a dark field measurement. In an embodiment, the portion 42 of the second scattered radiation 22 consists at least predominantly of (i.e. more than half of or completely of) one or more non-zeroth order diffraction components, for example a −1 order diffraction component only or one or more of a −1, −2, −3 or higher order negative non-zeroth order diffraction component, scattered from the structure 8. In an embodiment, the one or more non-zeroth order diffraction components making up the portion 42 of the second scattered radiation 31 is/are opposite in sign to the one of the one or more non-zeroth order diffraction components of the portion 41 of the first scattered radiation 31.

In an embodiment, the detection branch further directs second reference radiation 52 onto the sensor 6 at the same time as the portion 42 of the second scattered radiation 32. In an embodiment, the second reference radiation 52 comprises a plane wave or a spherical wave. A second interference pattern is formed by interference between the portion 42 of the second scattered radiation 32 reaching the sensor 6 and the second reference radiation 52. The portion 42 of the second scattered radiation 32 reaching the sensor 8 is at least sufficiently coherent at the sensor 8 with the second reference radiation 52 for the second interference pattern to be formed and for the second interference pattern to be detectable by the sensor 6. The second interference pattern is recorded by the sensor 6.

Figure 4:
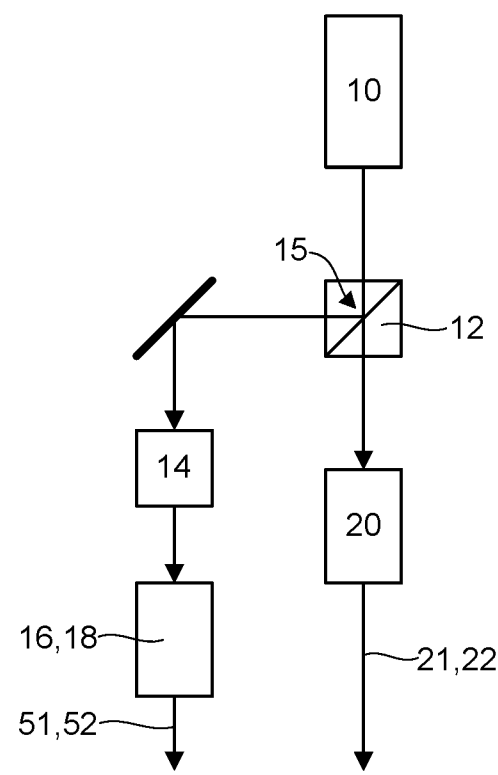
FIG. 4 depicts a schematic representation of an arrangement for providing illumination radiation and reference radiation for use in the metrology apparatus of FIG. 3.

FIG. 4 depicts a schematic representation of an example arrangement for providing the first illumination radiation 21, the second illumination radiation 22, the first reference radiation 51, and the second reference radiation 52 for use in the metrology apparatus of FIG. 3. A radiation source 10 provides a radiation beam to a beam splitter 12. The radiation source 10 generates a radiation beam of temporally and spatially coherent, or temporally and spatially partially coherent, or temporally coherent and spatially partially incoherent electromagnetic radiation (but sufficiently coherent for interference to take place at the sensor 6). In an embodiment, the radiation beam has a wavelength in the visible wavelength range. In an embodiment, the radiation beam has a wavelength in the infrared wavelength range. In an embodiment, the radiation beam has a wavelength in the ultraviolet wavelength range. In an embodiment, the radiation beam has a wavelength in the deep ultraviolet (DUV) wavelength range. In an embodiment, the radiation beam has a wavelength in the range between the infrared wavelength range and the DUV wavelength range. In an embodiment, the radiation beam has a wavelength in the extreme ultraviolet (EUV) wavelength range. In an embodiment, the radiation source 10 is configured to generate radiation at a controllable wavelength. In an embodiment, the radiation source 10 comprises a filtering unit for generating the radiation of a controllable wavelength from radiation having a broadband spectral distribution.

The radiation beam is split by the beam splitter 12 to provide illumination radiation and reference radiation. In the example shown, a first part of the split radiation beam, representing reference radiation, passes through a delay element 14 and a reference optical unit 16, 18. The reference optical unit 16, 18 directs the reference radiation (e.g. the first reference radiation 51 or the second reference radiation 52) onto the sensor 6. In some embodiments, the reference optical unit 16, 18 receives the first reference radiation 51 and the second reference radiation 52 before directing the radiation onto the sensor 6 and may therefore be referred to as a reception unit. A second part of the split radiation beam, representing illumination radiation, passes through an illumination optical unit 20. The illumination optical unit 20 directs the illumination radiation (e.g. the first illumination radiation 21 or the second illumination radiation 22) onto the structure 8. An optical path length between a point 15 where the radiation beam is split by the beam splitter 12 and the sensor 6 may be adjusted by the delay element 14. The delay element 14 may comprise any suitable arrangement for introducing a phase delay, for example by controllably increasing a path length of the radiation passing through the delay element 14. The delay element 14 may be implemented based on the principle discussed below with reference to FIG. 12, for example, involving mirrors 210 and 218. In the present example, the delay element 14 is provided in the optical path between the beam splitter 12 and the reference optical unit 16, 18, but a delay element 14 could alternatively or additionally be provided in the optical path between the beam splitter 12 and the illumination optical unit 20. As will be discussed in further detail below, in some embodiments the path difference is set to be equal for each of the two optical paths between the beam splitter 12 and the sensor 6 (i.e. via the structure 8 and not via the structure 8). This condition may be met by tuning the phase element 14 and/or by accurate alignment of optical elements between the beam splitter 12 and the sensor 6.

The combination of the radiation source 10 and the optical unit 20 that together provide the first illumination radiation 21 and the second illumination radiation 22 may be referred to as an illumination branch of the metrology apparatus. Components downstream of the structure 8, including the optical system 2 for guiding scattered radiation to the sensor 6 and components that guide the first reference beam 51 and the second reference beam 52 to the sensor 6 (including in the example described above the beam splitter 12, the delay element 14, and the reference beam optical unit 16, 18) may be referred to as a detection branch of the metrology apparatus.

Figure 5:
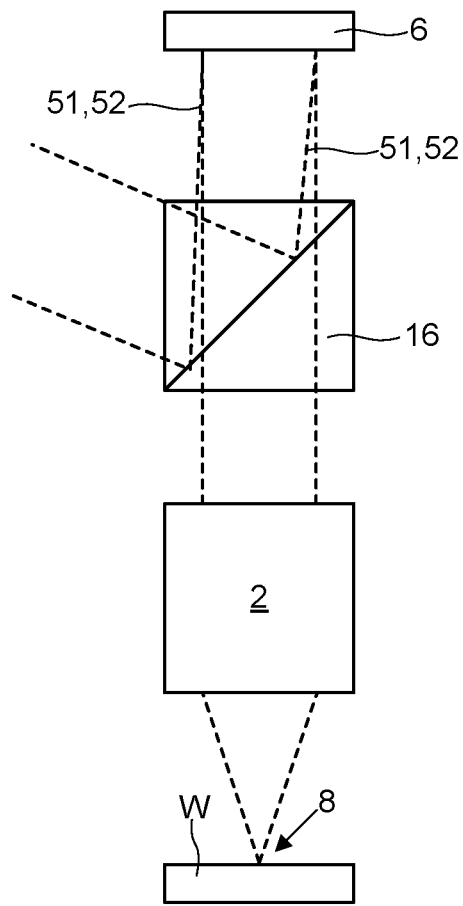
FIG. 5 depicts a first arrangement for directing reference radiation onto a sensor.
Figure 6:
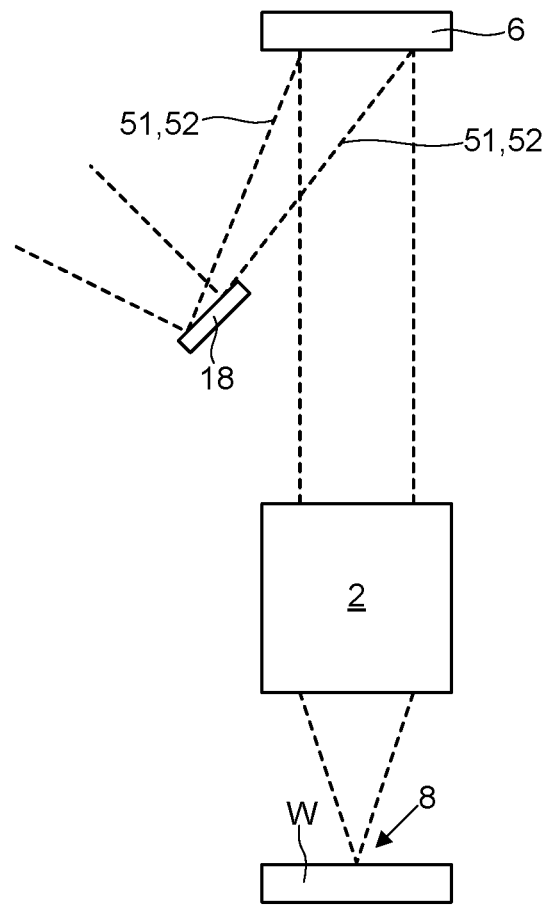
FIG. 6 depicts a second arrangement for directing reference radiation onto a sensor.

Two examples of arrangements for implementing the reference optical unit 16, 18 are respectively depicted in FIGS. 5 and 6. In FIG. 5, the reference optical unit 16 redirects the first reference radiation 51 and the second reference radiation 52 using a beam splitter located in an optical path of the portion 41 of the first scattered radiation 31 and the portion 42 of the second scattered radiation 32 (which are both transmitted through the beam splitter). In FIG. 6, the reference optical unit 18 redirects the first reference radiation 51 and the second reference radiation 52 using a reflective element located outside of the optical path of the portion 41 of the first scattered radiation 31 and the portion 42 of the second scattered radiation 32.

The characteristic of the structure 8 is determined by a processing unit 70 of the metrology apparatus. The processing unit 70 uses the first interference pattern and the second interference pattern recorded by the sensor 6 to determine the characteristic of the structure 8. In an embodiment, the processing unit 70 is coupled to the sensor 6 to receive a signal comprising information about the first interference pattern and the second interference pattern recorded by the sensor 6. In an embodiment, the processing unit 70 corrects for aberrations of the optical system 2. In an embodiment, the measurements of the first interference pattern and the second interference pattern are performed with radiation at multiple different wavelengths sequentially in time (in series) and the processing unit 70 is configured to use the measurements at multiple wavelengths sequentially in time (in series) to determine the characteristic of the structure 8 on the substrate W.

In an embodiment, the processing unit 70 uses the first interference pattern to calculate a complex field of radiation at the sensor 6 ("complex" here meaning that both amplitude and phase information is present) associated with the first scattered radiation 31. Similarly, the processing unit 70 uses the second interference pattern to calculate a complex field of radiation at the sensor 6 associated with the second scattered radiation 32. Such calculation of a complex field of radiation from an interference pattern formed by interfering reference radiation with radiation scattered from an object is known in general terms from holography. Further details about how to perform such calculations in the context of lithography for metrology may be found for example in US2016/0061750A1, which is hereby incorporated by reference.

If the characteristics of the optical system 2 are known, it is possible to mathematically back-propagate each of the calculated complex fields to obtain the corresponding complex fields of the first scattered radiation 31 and the second scattered radiation 32 at the structure 8.

Having knowledge of the complex field provides additional information for determining the characteristic of the structure 8 on the substrate W, relative to alternative modes in which phase and amplitude information are not both available. For example, in European patent application EP18158745.2, filed on Feb. 27, 2018, it has been disclosed how phase information of the scattered radiation can be used to determine overlay errors between structures of different layers on the substrate (an example of a characteristic of the structure to be determined). European patent application EP18158745.2 is hereby incorporated by reference.

In an embodiment, the characteristic of the structure is determined by comparing the first interference pattern and the second interference pattern. In an embodiment, the characteristic of the structure is determined based on a difference between the first interference pattern and the second interference pattern. The difference between the first interference pattern and the second interference pattern may, for example, contain information about an asymmetry in the structure 8. Obtaining information about asymmetry in the structure 8 may provide information about overlay. In an embodiment, phase information obtained from the calculated complex fields is used to obtain overlay information, as described in EP18158745.2, filed Feb. 27, 2018. Overlay describes unwanted misalignment between different patterns in the structure 8, such as patterns formed at different times, formed using different processes and/or formed in different layers. In other embodiments, the characteristic of the structure 8 being determined may comprise an error indicative of an error in focus of radiation used in a lithographic process to manufacture the structure 8. In still other embodiments, the characteristic of the structure 8 being determined may comprise an error indicative of an error in radiation dose of radiation used in a lithographic process to manufacture the structure 8.

It is important to minimize contributions to the difference between the first interference pattern and the second interference pattern that do not originate from the structure 8. The inventors have found that these unwanted contributions can be reduced by controlling the azimuthal angle of the first reference radiation 51 onto the sensor 8 to be different (optionally by 180±30 degrees) to an azimuthal angle of the second reference radiation 52 onto the sensor 6, in the reference frame of the structure 8. Thus, in some embodiments, the azimuthal angle of the first reference radiation 51 onto the sensor 6 is arranged to be different (optionally by 180±30 degrees) to the azimuthal angle of the second reference radiation 52 onto the sensor 6, in the reference frame of the structure 8. The reference frame of the structure 8 may rotate relative to the sensor 6 if the substrate W is rotated between illumination with the first illumination radiation 21 and illumination with the second illumination radiation 22. In some embodiments, a difference between the azimuthal angle of the first illumination radiation and an azimuthal angle of the second illumination radiation is nominally 180 degrees, for example 180±5 degrees, optionally 180±2 degrees, optionally 180 degrees±1 degrees, or optionally as close as possible to 180 degrees within engineering tolerances.

Referring again to FIG. 3, we now introduce definitions and terminology to support further explanations of the underlying mechanisms. We refer exclusively to the first illumination radiation 21, first scattered radiation 31, the portion 41 of the first scattered radiation 31, and the first reference radiation 51 for simplicity, but it will be understood that the analysis is equally applicable to the second illumination radiation 22, second scattered radiation 32, the portion 42 of the second scattered radiation 32, and the second reference radiation 52.

The first illumination radiation 21 has a wavelength λ and polar angle $\theta_{ill}$. The first scattered radiation 31 generated by scattering of the first illumination radiation 21 from the structure 8 may be described by the following grating equation in the case where the structure 8 comprises a periodic structure, such as a diffraction grating, with pitch P:

$$\sin(\theta_m) = m\frac{\lambda}{P} - \sin(\theta_{ill})$$

where m represents the order of diffraction from the structure 8 and $\theta_m$ represents the polar angle of first scattered radiation 31 consisting of an mth order diffraction component.

The portion 41 of the first scattered radiation 21 incident on the sensor 6 may be represented by the following expression:

$$E_o = A_o \exp\left(j2\pi\frac{L}{\lambda}\right)\exp\left(j\frac{2\pi}{\lambda}\vec{n}_o \cdot \vec{r}\right)$$

where $E_o$ represents the electric field component of the propagating radiation, $A_o$ represents amplitude, L represents a path length difference between a point 15 where a radiation beam is split to generate the first illumination radiation 21 and the first reference radiation 51 (see discussion of FIG. 4 above) and the sensor 6, $\vec{n}_o$ is a unit vector representing the direction of the propagating radiation, and $\vec{r}$ is the vector position coordinate of the propagating radiation.

The unit vector $\vec{n}_o$ may be represented as follows:

$$\vec{n}_o = \begin{pmatrix} n_{xo} \\ n_{yo} \\ n_{zo} \end{pmatrix} = \begin{pmatrix} \sin(\theta_o)\cos(\varphi_o) \\ \sin(\theta_o)\sin(\varphi_o) \\ \cos(\theta_o) \end{pmatrix}$$

where $n_{xo}$, $n_{yo}$ and $n_{zo}$ are the x-, y-, and z-coordinates of $\vec{n}_o$, $\theta_o$ is the polar angle, and $\varphi_o$ is the azimuthal angle.

A corresponding expression may be used to represent the first reference radiation 51 incident on the sensor, as follows:

$$E_r = A_r \exp\left(j\frac{2\pi}{\lambda}\vec{n}_r \cdot \vec{r}\right)$$

where $E_r$ represents the electric field component of the propagating radiation, $A_r$ represents amplitude, $\vec{n}_r$ is a unit vector representing the direction of the propagating radiation, and $\vec{r}$ is the vector position coordinate of the propagating radiation.

The unit vector $\vec{n}_r$ may be represented as follows:

$$\vec{n}_r = \begin{pmatrix} n_{xr} \\ n_{yr} \\ n_{zr} \end{pmatrix} = \begin{pmatrix} \sin(\theta_r)\cos(\varphi_r) \\ \sin(\theta_r)\sin(\varphi_r) \\ \cos(\theta_r) \end{pmatrix}$$

where $n_{xr}$, $n_{yr}$, and $n_{zr}$ are the x-, y-, and z-coordinates of $\vec{n}_r$, $\theta_r$ is the polar angle, and $\varphi_r$ is the azimuthal angle.

For planar diffraction in the (x,z) plane (see the top of FIG. 3 for the orientation of the Cartesian frame of reference), $\sin(\varphi_o)=0$. For the optical system 2 depicted, comprising lenses have focal lengths $F_1$ and $F_2$, the following expression also holds:

$$\sin(\theta_o) = \frac{F_1}{F_2}\sin(\theta_1)$$

The intensity I in an image plane recorded by the sensor 6 is given by $I=|E_o+E_r|^2$.

Expanding the above expression using the expressions for $E_o$ and $E_r$ given above yields the following:

$$I = A_o^2 + A_r^2 + 2A_oA_r \cos\left(\frac{2\pi}{\lambda}(L + (\vec{n}_o - \vec{n}_r)\cdot\vec{r})\right)$$

Figure 7:
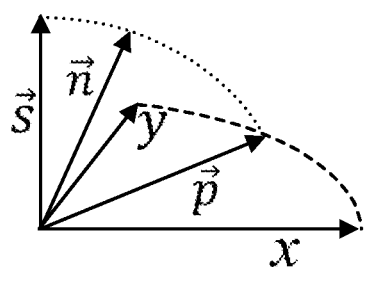
FIG. 7 depicts a naming convention for referring to directions of propagation of radiation.

The sensor 6 detects intensity only in the (x,y) plane, so it is useful to split the unit vectors into an in-plane (parallel) unit vector $\vec{p}$ and a perpendicular unit vector $\vec{s}$ using the following expression:

$$\vec{n} = \sin(\theta_o)\vec{p} + \cos(\theta_o)\vec{s}$$

as depicted in FIG. 7.

Figure 8:
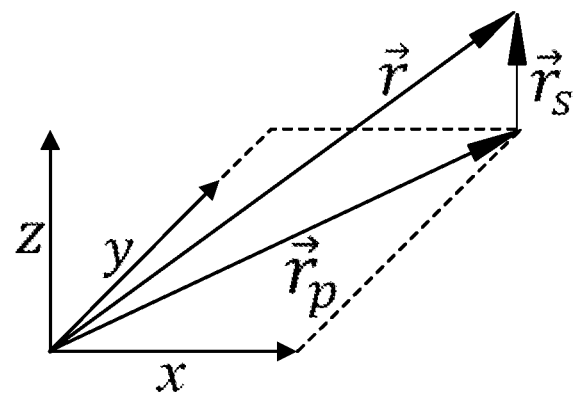
FIG. 8 depicts a naming convention for referring to positions in space.

The position vector $\vec{r}$ may also be decomposed into a z-component $\vec{r}_s$ and an in-plane (x,y) component $\vec{r}_p$ as depicted in FIG. 8.

The intensity $I(\vec{r}_p)$ in the image plane recorded by the sensor 6 can then be written as follows:

$$I(\vec{r}_p) = A_o^2 + A_r^2 + 2A_oA_r \cos\left(\frac{2\pi}{\lambda}(L + (\sin(\theta_o)\vec{p}_o - \sin(\theta_r)\vec{p}_r)\cdot\vec{r}_p)\right)$$

The in-plane propagation of the mth order diffraction component is given by the grating vector equation (so including the case of conical diffraction by a 1D periodic grating):

$$\sin(\theta_m)\vec{p}_m = m\frac{\lambda}{P}\vec{p}_G - \sin(\theta_{ill})\vec{p}_{ill}$$

Using the sine-rule from imaging, $$\sin(\theta_o)\vec{p}_o = \frac{1}{M}\sin(\theta_m)\vec{p}_m,$$

where M represents the magnification of the optical system 2 and is given by the ratio $F_1/F_2$ for the example shown in FIG. 3, it follows that the expression for $I(\vec{r}_p)$ can be rewritten as $$I(\vec{r}_p) = A_o^2 + A_r^2 +$$

-continued
$$2A_oA_r \cos\left(\frac{2\pi}{\lambda}L + \left(\frac{2m\pi}{MP}\vec{p}_G - \frac{2\pi}{\lambda}\left(\frac{\sin(\theta_{ill})}{M}\vec{p}_{ill} - \sin(\theta_r)\vec{p}_r\right)\right)\cdot\vec{r}_p\right)$$

If we define a sensitivity vector $\vec{S}_p$ as $$\vec{S}_p = \frac{\sin(\theta_{ill})}{M}\vec{p}_{ill} - \sin(\theta_r)\vec{p}_r,$$

the expression for $I(\vec{r}_p)$ can be simplified to yield the following expression:

$$I(\vec{r}_p) = A_o^2 + A_r^2 + 2A_oA_r \cos\left(\frac{2\pi}{\lambda}(L - \vec{S}_p\cdot\vec{r}_p) + \frac{2m\pi}{MP}\vec{p}_G\cdot\vec{r}_p\right)$$

This expression is valid for monochromatic light (equivalent to infinite coherence length). Quasi-monochromatic light contains a range of wavelengths centered around a center wavelength $\lambda_c$. For small wavelength deviations $\Delta\lambda$ away from the central wavelength it is possible to use the following approximation for the wavelength $\lambda$:

$$\frac{1}{\lambda} = \frac{1}{\lambda_c + \Delta\lambda} \approx \frac{1}{\lambda_c} - \frac{\Delta\lambda}{\lambda_c^2}$$

Using this approximation, the expression for $I(\vec{r}_p)$ can be written as follows:

$$I(\vec{r}_p) =$$
$$A_o^2 + A_r^2 + 2A_oA_r \cos\left(2\pi\left(\frac{1}{\lambda_c} - \frac{\Delta\lambda}{\lambda_c^2}\right)(L - \vec{S}_p\cdot\vec{r}_p) + \frac{2m\pi}{MP}\vec{p}_G\cdot\vec{r}_p\right)$$

The total intensity can now be obtained by integrating over the wavelength range that runs from $-B/2$ to $B/2$ where B is sufficiently large to cover all the light in the spectrum:

$$I_T(\vec{r}; \lambda_c, B) = \frac{1}{B}\int_{-\frac{B}{2}}^{\frac{B}{2}} I(\vec{r}; \lambda_c, \Delta\lambda)d\Delta\lambda$$

For a symmetric spectrum (which is expected to be a good approximation in this context) it is possible to write the integral as follows:

$$I_T(\vec{r}_p) =$$
$$A_o^2 + A_r^2 + 2A_oA_r\ C(\vec{r}_p; B, \lambda_c)\cos\left(2\pi\left(\frac{1}{\lambda_c}\right)(L - \vec{S}_p\cdot\vec{r}_p) + \frac{2m\pi}{MP}\vec{p}_G\cdot\vec{r}_p\right)$$

where C is a coherence term that describes the local image contrast at position $\vec{r}_p$. Assuming a simple rectangular spectrum with full bandwidth B yields the following expression for the coherence term C:

$$C(\vec{r}_p; \lambda_c, B) = \frac{1}{B} \int_{-\frac{B}{2}}^{\frac{B}{2}} \cos\left\{2\pi\left[\frac{\Delta\lambda}{\lambda_c^2}\right][L - \vec{S}_p - \vec{r}_p]\right\} d\Delta\lambda$$

Evaluating this integral yields the following:

$$C(\vec{r}_p; \lambda_c, B) = \mathrm{sinc}\left[\pi\left[\frac{B}{\lambda_c^2}\right][L - \vec{S}_p \cdot \vec{r}_p]\right]$$

For high performance of the above-described methods of determining the characteristic (e.g. overlay, error from focus error, or error from dose error) of the structure 8, it is desirable for the contrast function C to be the same for the first interference pattern (formed from the portion 41 of the first scattered radiation 31 and the first reference radiation 51) and the second interference pattern (formed from the portion 42 of the second scattered radiation 32 and the second reference radiation 52).

In some embodiments, the first interference pattern is formed by illuminating the structure 8 with the first illumination radiation 21 in such a way that the portion 41 of the first scattered radiation 31 reaching the sensor 6 only comprises a +1 order diffraction component (and not any zeroth order, specular, component or −1 order diffraction component). Additionally, the second interference pattern is formed by illuminating the structure 8 with the second illumination radiation 22 in such a way that the portion 42 of the second scattered radiation 32 reaching the sensor 6 only comprises a −1 order diffraction component (and not any zeroth order, specular, component or +1 order diffraction component). This configuration may be realised, for example, by arranging for the first interference pattern to be formed by illuminating the structure 8 with first illumination radiation 21 directed onto the structure 8 at a polar angle of $\theta_{ill}$ and azimuthal angle of $\varphi_{ill}$ and for the second interference pattern to be formed by illuminating the structure 8 with second illumination radiation 22 directed onto the structure 8 at a polar angle of $-\theta_{ill}$ and azimuthal angle of $\varphi_{ill}+\pi$ radians. Thus, the difference between the azimuthal angles of the first illumination radiation 21 and the second illumination radiation 22 in the reference frame of the structure 8 would be nominally 180 degrees (or π radians), for example 180±5 degrees, optionally 180±2 degrees, optionally 180 degrees±1 degrees, or optionally as close as possible to 180 degrees within engineering tolerances.

The contrast function C can be made the same for the first interference pattern and the second interference pattern, in this context, by satisfying two conditions.

The first condition is that L should be set equal to zero. Where the radiation beam is split to generate the first illumination radiation 21 and the first reference radiation 51, and to generate the second illumination radiation 22 and the second reference radiation 52, this means that the optical path length between the point 15 where the radiation beam is split and the sensor 6 should be equal for each of the first illumination radiation 21 and the first reference radiation 51, and for each of the second illumination radiation 22 and the second reference radiation 52. These conditions may be achieved, for example, as described above with reference to FIG. 4 (e.g. by tuning via a delay element 14 in one or both of the optical paths, or by accurate alignment of other optical elements affecting the optical path length).

The second condition arises because the sensitivity vector term $\vec{S}_p$, which is given by $$\vec{S}_p = \frac{\sin(\theta_{ill})}{M}\vec{p}_{ill} - \sin(\theta_r)\vec{p}_r,$$

must reverse sign if the illumination direction is reversed (i.e. where $\theta_{ill}$ goes to $-\theta_{ill}$ and $\varphi_{ill}$ goes to $\varphi_{ill}+\pi$). This means that the direction of the first reference beam 51 in the (x, y) plane must also be of opposite sign to the direction of the second reference beam 52 in the (x, y) plane. This is the second condition, which effectively requires the following: if the polar angle of the first reference radiation 51 is $\theta_r$, the polar angle of the second reference radiation 52 should be $-\theta_r$; and if the azimuthal angle of the first reference radiation 51 is $\varphi_r$, the azimuthal angle of the second reference radiation 52 should be $\varphi_r+\pi$ radians. In other words, the difference between the azimuthal angle of the first reference radiation 51 onto the sensor 6 and the azimuthal angle of the second reference radiation 52 onto the sensor 6 is nominally 180 degrees, for example 180±5 degrees, optionally 180±2 degrees, optionally 180 degrees±1 degrees, or optionally as close as possible to 180 degrees within engineering tolerances. A significant improvement in performance is expected up to around 30 degrees deviation from 180 degrees, but low deviation is expected to be favorable in most practical situations.

If the above two conditions are satisfied the contrast function $C_1$ for the first interference pattern and the contrast function $C_2$ for the second interference pattern are equal, as follows:

$$C_1(\vec{r}_p; \lambda_c, B) = \mathrm{sinc}\left[\pi\frac{B}{\lambda_c^2}\vec{S}_p \cdot \vec{r}_p\right]$$

$$C_2(\vec{r}_p; \lambda_c, B) = \mathrm{sinc}\left[-\pi\frac{B}{\lambda_c^2}\vec{S}_p \cdot \vec{r}_p\right] = C_1$$

Figure 9:
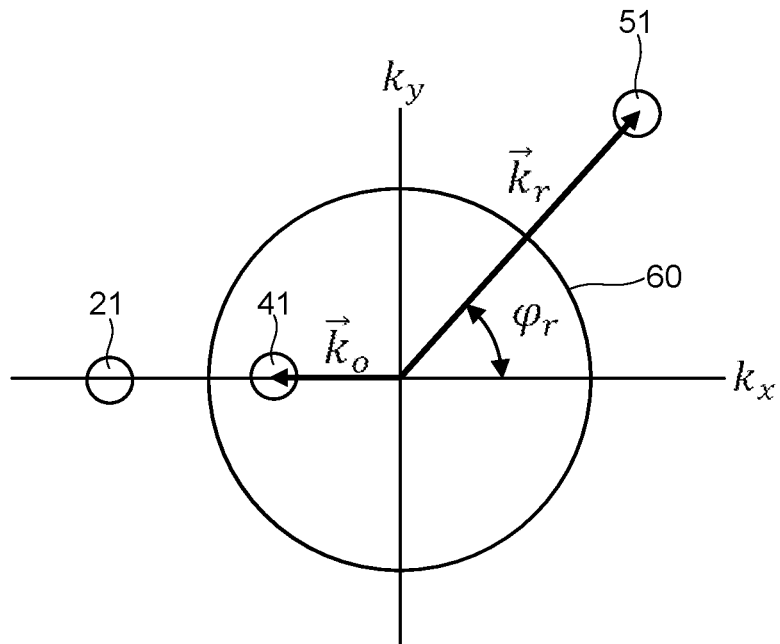
FIG. 9 is a k-space representation showing first illumination radiation, first scattered radiation, and first reference radiation.
Figure 10:
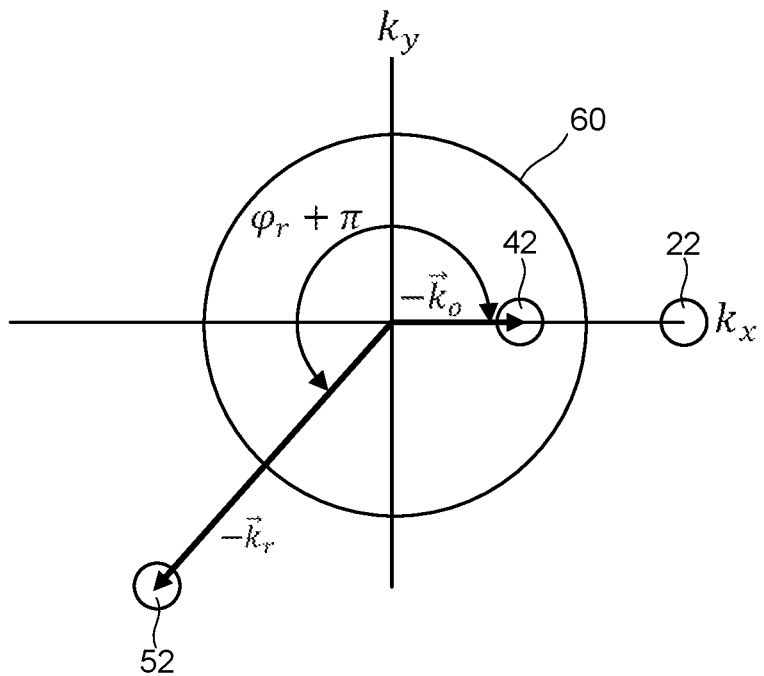
FIG. 10 is a k-space representation showing second illumination radiation, second scattered radiation, and second reference radiation.

FIGS. 9 and 10 provide visualizations in k-space (in the ($k_x$, $k_y$) plane) of arrangements in which the above two conditions are satisfied. FIG. 9 depicts positions in k-space for generating the first interference pattern. FIG. 10 depicts positions in k-space for generating the second interference pattern.

The large circular region 60 represents a numerical aperture of the optical system 2. Radiation outside the region 60 will not be captured by the optical system 2 and cannot therefore contribute to the interference pattern recorded by the sensor 6. Radiation inside the region 60 is captured by the optical system 2 and can therefore contribute to the interference pattern recorded by the sensor 6.

In FIG. 9, the k-vector of the first illumination radiation is labelled 21. The first illumination radiation 21 generates first scattered radiation. The first scattered radiation comprises a specular reflection component (not shown). The specular reflection component falls outside of the region 60 and is thereby excluded from contributing to the first interference pattern. The first scattered radiation also comprises a +1 order diffraction component. The +1 order diffraction component falls within the region 60 and constitutes a portion 41 of the first scattered radiation that is guided to the sensor 6 by the optical system 2. The portion 41 of the first scattered radiation contributes to the first interference pattern. The k-vector of the portion 41 of the first scattered radiation is labelled $\vec{k}_o$ and is given by the following expression:

$$\vec{k}_o = \frac{2\pi}{\lambda}\vec{n}_o$$

The first reference radiation is labelled 51. The k-vector of the first reference radiation 51 is labelled $\vec{k}_r$ and given by the following expression:

$$\vec{k}_r = \frac{2\pi}{\lambda}\vec{n}_r$$

The azimuthal angle of the first reference radiation 51 is $\varphi_r$.

In FIG. 10, the k-vector of the second illumination radiation is labelled 22. The second illumination radiation 22 generates second scattered radiation. The second scattered radiation comprises a specular reflection component (not shown). The specular reflection component falls outside of the region 60 and is thereby excluded from contributing to the second interference pattern. The second scattered radiation also comprises a −1 order diffraction component. The −1 order diffraction component falls within the region 60 and constitutes a portion 42 of the second scattered radiation that is guided to the sensor 6 by the optical system 2. The portion 42 of the second scattered radiation contributes to the second interference pattern. The k-vector of the portion 42 of the second scattered radiation is labelled $\vec{k}_o$ and is given by the following expression:

$$\vec{k}_o = \frac{2\pi}{\lambda}\vec{n}_o$$

The second reference radiation is labelled 52. The k-vector of the second reference radiation is labelled $\vec{k}_r$ and given by the following expression:

$$\vec{k}_r = \frac{2\pi}{\lambda}\vec{n}_r$$

The azimuthal angle of the second reference radiation 51 is $\varphi_r + \pi$ radians. In the ($k_x$, $k_y$) plane, the arrangement of FIG. 10 can be seen as a 180 degree rotation of the arrangement of FIG. 9, leading to a reversal in sign of the direction of the first illumination radiation 21 relative to the second illumination radiation 22 and a reversal in sign of the direction of the first reference radiation 51 relative to the second reference radiation 52 (in the x-y plane).

In some embodiments, as depicted in FIGS. 9 and 10, the azimuthal angle of the first reference radiation 51 is oblique with respect to the azimuthal angle of the first illumination radiation 21. Thus, a difference between the azimuthal angle of the first reference radiation 51 and the azimuthal angle of the first illumination radiation 21 is not equal to 90 degrees or a multiple of 90 degrees. Allowing the difference to be an oblique angle provides freedom for improving the robustness of the methods of determining the characteristic of the structure 8.

In an embodiment, the relative directions of the first illumination radiation 21 and the first reference radiation 51 are adjusted to reduce a variation of contrast with position in the first interference pattern. In an embodiment, this is achieved by adjusting the relative directions of the first illumination radiation 21 and the first reference radiation 51 to reduce a size of the sensitivity vector $\vec{S}_p$. Reducing the size of the sensitivity vector $\vec{S}_p$ decreases the sensitivity to position of the contrast function C. Reducing the sensitivity to position of the contrast function C facilitates formation of useful features (e.g. fringes) in the first interference pattern. In an embodiment, corresponding adjustments are made to the relative directions of the second illumination radiation 22 and the second reference radiation 52 to reduce the sensitivity vector for the second interference pattern.

In an embodiment, an optical property of the optical system 2 used to guide the portion 41 of the first scattered radiation 31 reaching the sensor 6 from the structure 8 to the sensor 6 is adjusted to reduce the variation of contrast with position in the first interference pattern. In an embodiment, the optical property that is adjusted comprises a magnification M of the optical system 2 (e.g. $F_1/F_2$ in the example of FIG. 3). In an embodiment, reduction in the variation of contrast with position is achieved by adjusting the optical property to reduce a size of the sensitivity vector $\vec{S}_p$. In an embodiment, the adjustment of the optical property is performed in combination with the adjustment of the relative directions of the first illumination radiation 21 and the first reference radiation 51 to achieve an increased reduction of the variation of contrast with position (e.g. via reduction of the sensitivity vector $\vec{S}_p$). The advantage of adjusting the optical property in combination with the adjustment of the relative directions of the first illumination radiation 21 and the first reference radiation 51 can be appreciated from the form of the sensitivity vector $\vec{S}_p$ discussed above, which is $$\vec{S}_p = \frac{\sin(\theta_{ill})}{M}\vec{p}_{ill} - \sin(\theta_r)\vec{p}_r,$$

and can be seen to depend on both the magnification M of the optical system 2 and the relative directions of the first illumination radiation 21 and the first reference radiation 51. In an embodiment, corresponding adjustments are made to achieve reduction of the variation of contrast with position in the second interference pattern.

With dark field holography such as that described above, and illumination radiation with a limited temporal coherence length (non-monochromatic illumination), the alignment requirements of optical elements participating in formation of the respective interference patterns can be very demanding. The limited temporal coherence length means that the field of view where useful features (e.g. fringes) are visible can be limited, which makes extraction of information difficult. Fine tuning of the direction of the reference radiation, of the NA of the optical system 2, and of magnification and source bandwidth parameter ranges may be required to see the useful features in a wide enough region on the sensor 6. The above described techniques for reducing the sensitivity vector $\vec{S}_p$ provide the basis for systematic tuning of relevant parameters to facilitate optimal recording of useful features of the interference patterns.

Figure 11:
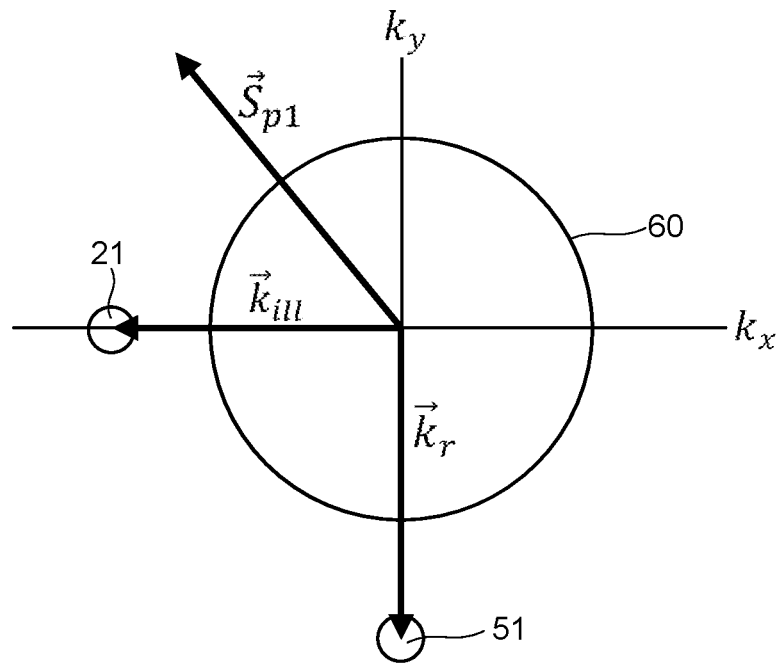
FIGS. 11 and 12 are k-space representations showing an alternative arrangement to that of FIGS. 9 and 10 in which the first reference radiation and second reference radiation are in the same direction and perpendicular to each of the first illumination radiation and the second illumination radiation in the plane of the sensor.
Figure 12:
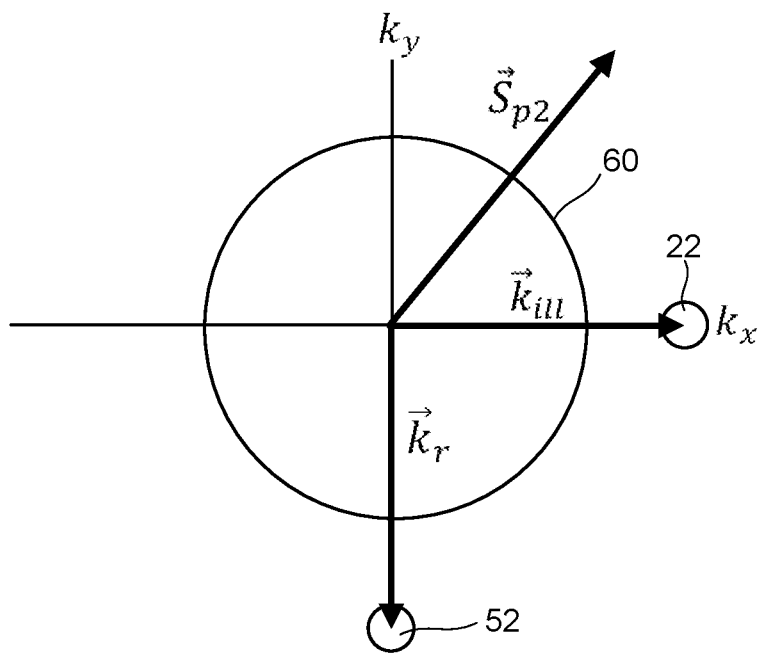

FIGS. 11 and 12 depict a variation on the embodiment described above with reference to FIGS. 9 and 10. According to this variation, instead of the azimuthal angle of the first reference radiation 51 onto the sensor 6 being different to the azimuthal angle of the second reference radiation 52 onto the sensor 6, the azimuthal angle of the first reference radiation 51 onto the sensor 6 is nominally identical (optionally within 5 degrees, optionally within 2 degrees, optionally within 1 degree) to an azimuthal angle of the second reference radiation 52 onto the sensor 6 and a difference between the azimuthal angle of the first reference radiation 51 onto the sensor 6 and each of an azimuthal angle of the first illumination radiation 21 onto the structure 8 and an azimuthal angle of the second illumination radiation 22 onto the structure 8 is 90±30 degrees, in the reference frame of the structure 8. In an embodiment, the difference between the azimuthal angle of the first reference radiation 51 onto the sensor 6 and each of the azimuthal angle of the first illumination radiation 21 onto the structure 8 and the azimuthal angle of the second illumination radiation 22 onto the structure 8 is nominally 90 degrees (optionally within 5 degrees, optionally within 2 degrees, optionally within 1 degree).

Arranging the relative directions of the first illumination radiation 21, first reference radiation 51, second illumination radiation 22 and second reference radiation 52 in this manner reduces unwanted differences between the first interference pattern and the second interference pattern at least in a direction parallel to components of the first reference radiation 51 and the second reference radiation 52 in the plane of the first interference pattern and the second interference pattern (parallel to the $k_y$ axis in FIGS. 11 and 12). This is due to a variation of contrast with position having mirror symmetry with respect to the $k_y$ axis. The contrast function $C_1$ for the first interference pattern (formed with the configuration of FIG. 11) and the contrast function $C_2$ for the second interference pattern (formed with the configuration of FIG. 12) are as follows:

$$C_1 = \mathrm{sinc}\left[\pi \frac{B}{\lambda_c^2} \vec{S}_{p1} \cdot \vec{r}_p\right]$$

$$C_2 = \mathrm{sinc}\left[\pi \frac{B}{\lambda_c^2} \vec{S}_{p2} \cdot \vec{r}_p\right]$$

where $\vec{S}_{p1}$ and $\vec{S}_{p2}$ are the respective sensitivity vector terms. The sensitivity vector terms $\vec{S}_{p1}$ and $\vec{S}_{p2}$ are plotted on FIGS. 11 and 12. It can be seen that the 180 degrees switch in direction of illumination between the configuration of FIG. 11 and the configuration FIG. 12 causes a change in the $k_x$ component of the respective sensitivity vector terms but no change in the $k_y$. The contrast function in the $k_y$ direction is unchanged by the change in direction of illumination. The contrast in the $k_x$ direction will thus be mirrored along the $k_y$ axis. Where a variation along the y-direction is primarily important for determining the characteristic of the structure 8 (e.g. overlay), for example due to symmetry properties of the structure 8, the achievement of unchanged contrast functions in the $k_y$ direction ensures reduction or avoidance of unwanted differences between the first interference pattern and the second interference pattern (e.g. differences not originating from the structure 8).

Further embodiments are now described with reference to FIGS. 13 and 14.

A metrology apparatus is disclosed for determining a characteristic of a structure manufactured on a substrate. The metrology apparatus uses the principles of holography to measure a complex radiation field of radiation scattered by the structure. The metrology apparatus comprises an illumination branch for illuminating the structure with radiation. The metrology apparatus comprises a detection branch for guiding a portion of the scattered radiation towards a sensor suitable for recording radiation impinging on the sensor. The detection branch comprises an optical element for capturing a portion of the scattered radiation excluding radiation from the specular reflection. The detection branch further comprises a reception unit for receiving reference radiation being coherent with respect to the radiation that illuminates the structure. The detection branch is configured to guide the reference radiation to the sensor for interfering, on the sensor, with the scattered radiation that is captured by the optical element.

The above metrology apparatus is a holographic setup and at the sensor an image is formed that is the result of interference between the reference radiation and a portion of the radiation scattered by the structure. Based on one or more images formed on the sensor, a complex field of radiation can be determined that comprises information about the scattered radiation. The optical element, and optional further optics, that guide the radiation towards the sensor contains aberrations that degrade the image formation on the camera. If the characteristics of the optical element are known, it is relatively easy to back-propagate the measured complex field of the scattered radiation towards the complex field that is scattered by the structure on the substrate. Having knowledge of the complex field of the scattered radiation is advantageous because it provides more information that can be used to determine characteristics of the structure on the substrate. For example, in European patent application EP18158745.2, filed on Feb. 27, 2018, it has been disclosed how phase information of the scattered radiation can be used to determine overlay errors between structures of different layers on the substrate. European patent application EP18158745.2 is hereby incorporated by reference.

In an embodiment, the optical element is not shared with the illumination branch.

Optionally, the sensor is arranged in a pupil plane of the optical element, or in a plane conjugate with the pupil plane. Optionally, the sensor is arranged in a field plane of the optical element. Optionally, the sensor is arranged in a plane that is configured in between the pupil plane of the optical element and the field plane.

In an embodiment, the optical element has a low Numerical Aperture (NA). Optionally, the NA of the optical element is lower than 0.3, optionally, lower than 0.2. Optionally, the optical element is a plano convex lens. The plano convex lens is isoplanatic and has relatively high aberrations. Optionally, the optical element is a plano asphere. The plano asphere is non-isoplanatic and has relatively low aberrations.

In an embodiment, the optical element has a high Numerical Aperture (NA). Optionally, the NA of the optical element is higher than 0.5, optionally, higher than 0.65, optionally, higher than 0.8.

In an embodiment, the metrology apparatus has a beam splitter that is configured to split a received radiation beam into a first beam with illumination radiation and into a second beam of reference radiation. Optionally, the metrology apparatus comprises a delay element in the optical path of the first beam or the second beam for controlling a phase difference between the first beam and the second beam.

Optionally, the metrology apparatus comprises a radiation source being configured to generate a beam of temporal and spatial coherent, or temporal and spatial partially coherent, or temporal coherent and spatially partially incoherent electromagnetic radiation. This beam of radiation is provided to the beam splitter.

Optionally the radiation has a wavelength in the visible wavelength range. Optionally, the radiation has a wavelength in the Infrared wavelength range. Optionally, the radiation has a wavelength in the Ultraviolet wavelength range. Optionally, the radiation has a wavelength in the deep ultraviolet (DUV) wavelength range. Optionally, the radiation has a wavelength in the extreme ultraviolet (EUV) wavelength range.

Optionally, the radiation source is configured to generate radiation at a controllable wavelength.

Optionally, the radiation source comprises a filtering unit for generating the radiation of a controllable wavelength from radiation having a broadband spectral distribution.

Optionally, the metrology apparatus comprises a processing unit for determining a characteristic of the structure on the substrate. The processing unit being coupled to the sensor for receiving a signal comprising information about radiation impinging on the sensor. Optionally, the processing unit being configured to correct for aberrations of the optical element. Optionally, the processing unit being configured to correct for the aberration in the pupil plane of the optical element.

Optionally, the metrology tool performs different measurements with radiation at different wavelengths and the processing unit being configured to use the different measurements to determine the structure on the substrate.

Figure 13:
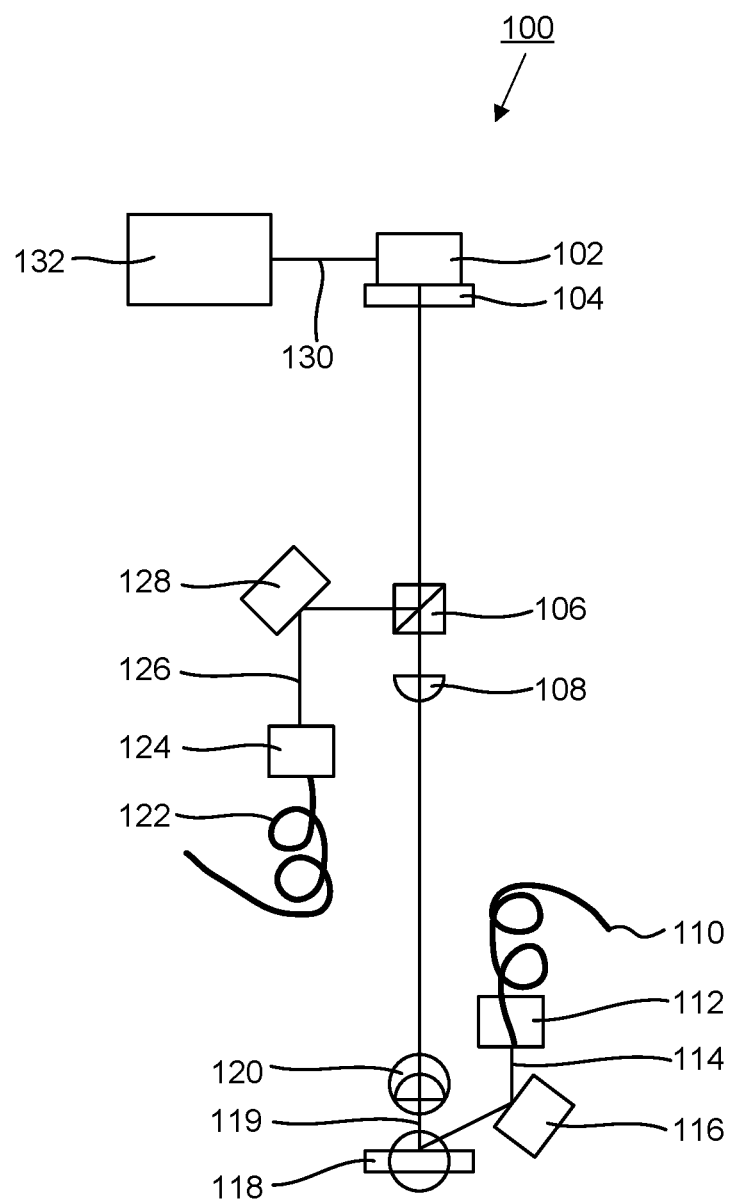
FIG. 13 depicts a schematic representation of a further metrology apparatus.

FIG. 13 presents an embodiment of a metrology apparatus 100. The metrology apparatus comprises a sensor 102 which may be a pixelated image sensor that is being configured to register an image of impinging radiation. Optionally, the metrology apparatus comprises a filter 104 that is configured to filter the radiation that impinges on the sensor 102. The filter 104 may be a polarizing filter.

Radiation 119 of (at least a portion of) a non-zero diffraction order of radiation scattered by a structure 118 on a substrate is guided along a detection branch from the structure 118 towards the sensor 102. In general radiation 119 is not the radiation of the specular reflection and if the document refers to non-zero diffraction order, one may also read radiation that excludes the specular reflected radiation. The detection branch also comprises a beam splitter 106 which allows the (partial) transmission of radiation 119 towards the sensor 102 and which reflects reference radiation 126 towards the sensor 102 as well. The detection branch at least comprises one optical element 120 that captures a portion of radiation scattered by the structure 118. In an embodiment, the optical element 120 captures a non-zero diffraction order of the scattered radiation. The optical element 120 may also capture multiple non-zero diffraction orders. The zeroth diffraction order (not shown in the figure) is reflected by the structure 118 at a reflection angle that is equal to the angle of incidence of illumination radiation 114. The detection branch may comprise a further optical element 108. The optical element 120 and the further optical element 108 may be refractive or reflective elements such as lenses or mirrors. Also a combination of lenses and mirrors can be used. Embodiments of the optical element 120 are discussed previously. The sensor 102 may be arranged in a pupil plane, or a plane conjugate with the pupil plane, of the optical element. In another embodiment, the sensor 102 may be arranged in the field plane of optical element 120.

The metrology apparatus also comprises an illumination branch which illuminates the structure 118 on the substrate.

The illumination branch comprises a illumination radiation reception unit 112 that receives, for example, from a glass fiber 110 the illumination radiation. The illumination radiation reception unit 112 transmits the illumination radiation 114 towards a mirror 116 which reflects the illumination radiation 114 towards the structure 118. In the drawn embodiment the illumination radiation impinges on the structure 118 at a non-zero angle of incidence. In another embodiment the illumination radiation impinges on the structure 118 at a non-zero angle of incidence and an optical axis of the detection branch has a non-zero angle with respect to a normal to the substrate on which the structure 118 is present. In the embodiment of FIG. 13, optical element 120 is not shared with the illumination branch of the metrology apparatus.

The metrology apparatus also comprises a reference illumination reception unit 124 which may receive reference radiation from, for example, a glass fiber 122. The reference radiation 126 is transmitted by the illumination reception unit 124 towards a mirror 128 which reflects the illumination radiation 126 towards element beam splitter 106. The reference radiation is coherent with respect to the illumination radiation 114.

The sensor 102 may be coupled to a processing unit 132. The sensor 102 provides a signal 130 that represents information of the radiation that impinges on the sensor 102. Optional tasks of processing unit 132 have been discussed above.

Figure 14:
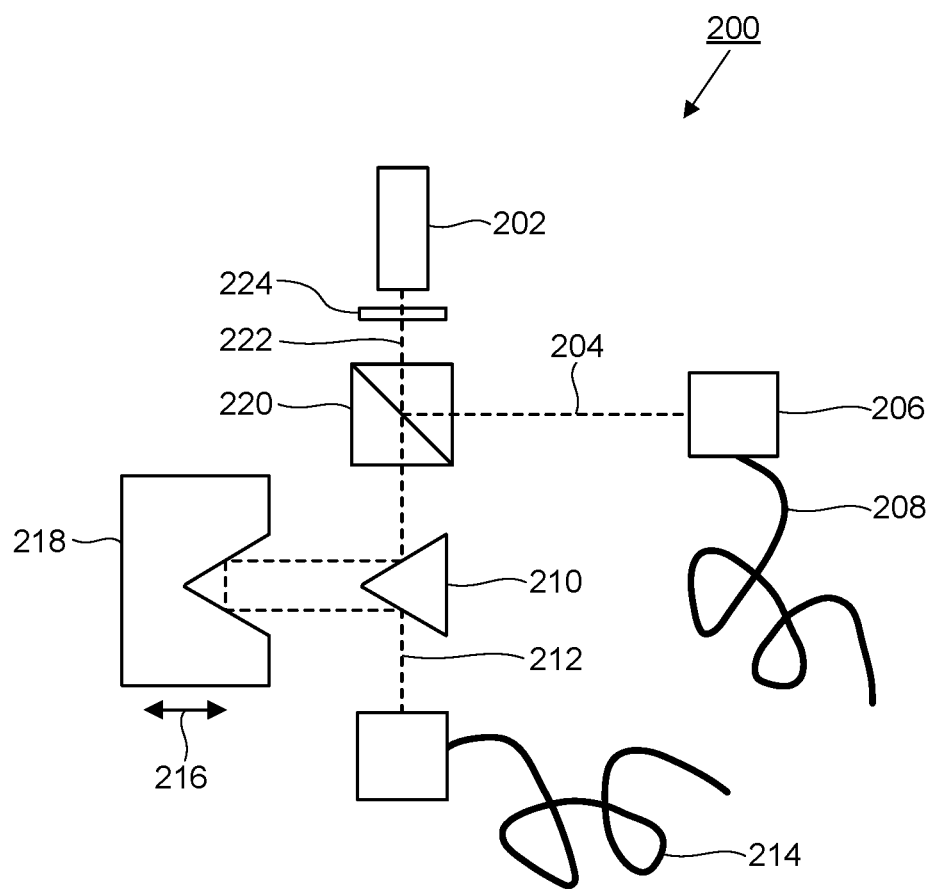
FIG. 14 depicts a schematic representation of an arrangement for providing coherent illumination radiation and reference radiation.

In order to generate the illumination radiation and the reference radiation that are coherent with respect to each other, the metrology apparatus may comprise a beam splitting arrangement 200 as presented in FIG. 14. A source 202 may provide a beam of radiation 222. This may be coherent radiation having a sufficient spatial coherence length and having sufficient temporal coherence. In general the radiation is one of temporal and spatial coherent, or temporal and spatial partially coherent, or temporal coherent and spatially partially incoherent electromagnetic radiation. The beam of radiation 222 is provided towards a beam splitter 220. In between the source 202 and the beam splitter 220 a filter unit 224 may be provided. The filter unit may be provided with interchangeable or controllable filters that allow the transmission of radiation of a single wavelength or only in a narrow spectral range towards the beam splitter 220. From the beam splitter two beams of radiation are transmitted.

One of the beams of radiation may be the reference radiation and another one of the beams of radiation may be the illumination radiation. In the example of FIG. 14 beam 204 comprises illumination radiation which may be coupled by unit 206 into a glass fiber 208 that may be coupled to glass fiber 110 of FIG. 13.

The other beam of radiation that is transmitted by the beam splitter 220 is transmitted towards a mirror 210 with a triangular cross-section. In the example of FIG. 14 this beam of radiation is the reference radiation 212. A first surface of mirror 210 reflects the reference radiation towards a mirror 218 that is formed by a recess in a material. The cross-sectional shape of the recess is triangular as well. The mirror 218 reflects the reference radiation at a slightly different position back to a second surface of mirror 210. The second surface reflects the reference radiation 212 towards a unit that couples the reference radiation into a fiber 214 which may be coupled to glass fiber 122 of FIG. 13. By translating the recessed mirror 218 in the directions indicated by arrow 216 a controllable time delay (=phase difference) between the illumination beam and reference beam can be realized. Also other means can be used to introduce the controllable time delay, such as, for example, by an optical wedge that can be moved in and out the beam.

In the above embodiments of FIGS. 13 and 14, glass fibers 110, 112, 208, 214 are used to transport radiation from the beam splitting arrangement towards the reception units 112, 124. The use of glass fibers is not essential. Also other means may be used to transport or transmit the radiation towards the reception units 112, 124. In an embodiment, the beam splitting arrangement 200 is completely integrated with the arrangement shown in FIG. 13 such that the radiation for illuminating the structure is transmitted directly to the structure 118 on the substrate and such that the reference radiation is transported directly to the beam splitter 106 or the sensor 102.

It is to be noted that the embodiments of FIGS. 13 and 14 are example of possible setups. The skilled person may come up with variation that have still the same functionality and are within the spirit of the invention.

A further embodiment is disclosed in the subsequent clause:

a. A metrology apparatus for determining a characteristic of a structure manufactured on a substrate comprising
  an illumination branch for illuminating the structure with radiation,
  a detection branch for guiding a portion of the scattered radiation towards a sensor suitable for recording radiation impinging on the sensor, the detection branch comprising an optical element for capturing a portion of the scattered radiation excluding radiation from the specular reflection, the detection branch further comprising a reception unit for receiving reference radiation being coherent with respect to the radiation that illuminates the structure, the detection branch is configured to guide the reference radiation to the sensor for interfering, on the sensor, with the scattered radiation that is captured by the optical element.

Further embodiments are disclosed in the subsequent numbered clauses:

1. A method of determining a characteristic of a structure manufactured on a substrate, comprising:
  illuminating the structure with first illumination radiation to generate first scattered radiation, and detecting on a sensor a first interference pattern formed by interference between a portion of the first scattered radiation reaching the sensor and first reference radiation;
  illuminating the structure with second illumination radiation, from a different direction to the first illumination radiation in a reference frame of the structure, to generate second scattered radiation, and detecting on the sensor a second interference pattern formed by interference between a portion of the second scattered radiation reaching the sensor and second reference radiation; and
  using the first interference pattern and the second interference pattern to determine the characteristic of the structure, wherein:
  an azimuthal angle of the first reference radiation onto the sensor is different to an azimuthal angle of the second reference radiation onto the sensor, in the reference frame of the structure.

2. The method of clause 1, wherein the difference between the azimuthal angle of the first reference radiation onto the sensor and the azimuthal angle of the second reference radiation onto the sensor is 180±30 degrees.

3. The method of clause 1 or 2, wherein a difference between the azimuthal angle of the first illumination radiation onto the structure and an azimuthal angle of the second illumination radiation onto the structure is nominally 180 degrees in the reference frame of the structure.

4. The method of any preceding clause, wherein:
  a radiation beam is split to generate the first illumination radiation and the first reference radiation; and
  an optical path length between a point where the radiation beam is split and the sensor is set to be equal for each of the first illumination radiation and the first reference radiation.

5. The method of any preceding clause, wherein:
  a radiation beam is split to generate the second illumination radiation and the second reference radiation; and
  an optical path length between a point where the radiation beam is split and the sensor is set to be equal for each of the second illumination radiation and the second reference radiation.

6. The method of any preceding clause, wherein the portion of the first scattered radiation reaching the sensor excludes a specular reflection component of the first scattered radiation.

7. The method of any preceding clause, wherein the portion of the second scattered radiation reaching the sensor excludes a specular reflection component of the second scattered radiation.

8. The method of any preceding clause, wherein the portion of the first scattered radiation reaching the sensor consists at least predominantly of one or more non-zeroth order diffraction components scattered from the structure.

9. The method of clause 8, wherein the portion of the second scattered radiation reaching the sensor consists at least predominantly of one or more non-zeroth order diffraction components scattered from the structure, the one or more non-zeroth order diffraction components being opposite in sign to the one or more non-zeroth order diffraction components of the portion of the first scattered radiation reaching the sensor.

10. The method of any preceding clause, wherein the azimuthal angle of the first reference radiation onto the sensor is oblique with respect to the azimuthal angle of the first illumination radiation onto the structure.

11. The method of any preceding clause, further comprising adjusting the direction of the first reference radiation onto the sensor relative to the direction of the first illumination radiation onto the structure to reduce a variation of contrast with position in the first interference pattern.

12. The method of clause 11, further comprising adjusting an optical property of an optical system used to guide the portion of the first scattered radiation reaching the sensor from the structure to the sensor to reduce the variation of contrast with position in the first interference pattern.

13. The method of clause 12, wherein the optical property comprises a magnification of the optical system.

14. A method of determining a characteristic of a structure manufactured on a substrate, comprising:
  illuminating the structure with first illumination radiation to generate first scattered radiation, and detecting on a sensor a first interference pattern formed by interference between a portion of the first scattered radiation reaching the sensor and first reference radiation;
  illuminating the structure with second illumination radiation, from a different direction to the first illumination radiation in a reference frame of the structure, to generate second scattered radiation, and detecting on the sensor a second interference pattern formed by interference between a portion of the second scattered radiation reaching the sensor and second reference radiation; and using the first interference pattern and the second interference pattern to determine the characteristic of the structure, wherein:
an azimuthal angle of the first reference radiation onto the sensor is nominally identical to an azimuthal angle of the second reference radiation onto the sensor and a difference between the azimuthal angle of the first reference radiation onto the sensor and each of an azimuthal angle of the first illumination radiation onto the structure and an azimuthal angle of the second illumination radiation onto the structure is 90±30 degrees, in the reference frame of the structure.

15. The method of any preceding clause, wherein each of the first reference radiation and the second reference radiation is a plane wave or a spherical wave.

16. The method of any preceding clause, wherein:
the portion of the first scattered radiation reaching the sensor is at least partially coherent at the sensor with the first reference radiation; and
the portion of the second scattered radiation reaching the sensor is at least partially coherent at the sensor with the second reference radiation.

17. The method of any preceding clause, wherein the determination of the characteristic of the structure is based on a difference between the first interference pattern and the second interference pattern.

18. The method of any preceding clause, wherein the determination of the characteristic of the structure comprises calculating a complex field of radiation from each of the first interference pattern and the second interference pattern and using the calculated complex fields to determine the characteristic of the structure.

19. The method of any preceding clause, wherein the characteristic of the structure comprises one or more of the following:
overlay;
an error indicative of an error in focus of radiation used in a lithographic process to manufacture the structure; and
an error indicative of an error in radiation dose of radiation used in a lithographic process to manufacture the structure.

20. A metrology apparatus configured to determine a characteristic of a structure manufactured on a substrate, comprising:
an illumination branch configured to illuminate the structure with first illumination radiation to generate first scattered radiation,
a detection branch configured to detect on a sensor a first interference pattern formed by interference between a portion of the first scattered radiation reaching the sensor and first reference radiation, wherein:
the illumination branch is further configured to illuminate the structure with second illumination radiation, from a different direction to the first illumination radiation in a reference frame of the structure, to generate second scattered radiation,
the detection branch is further configured to detect on the sensor a second interference pattern formed by interference between a portion of the second scattered radiation reaching the sensor and second reference radiation;
the apparatus further comprises a processing unit configured to use the first interference pattern and the second interference pattern to determine the characteristic of the structure; and
an azimuthal angle of the first reference radiation onto the sensor is different to an azimuthal angle of the second reference radiation onto the sensor, in the reference frame of the structure.

21. A metrology apparatus configured to determine a characteristic of a structure manufactured on a substrate, comprising:
an illumination branch configured to illuminate the structure with first illumination radiation to generate first scattered radiation,
a detection branch configured to detect on a sensor a first interference pattern formed by interference between a portion of the first scattered radiation reaching the sensor and first reference radiation, wherein:
the illumination branch is further configured to illuminate the structure with second illumination radiation, from a different direction to the first illumination radiation in a reference frame of the structure, to generate second scattered radiation,
the detection branch is further configured to detect on the sensor a second interference pattern formed by interference between a portion of the second scattered radiation reaching the sensor and second reference radiation;
the apparatus further comprises a processing unit configured to use the first interference pattern and the second interference pattern to determine the characteristic of the structure; and
an azimuthal angle of the first reference radiation onto the sensor is nominally identical to an azimuthal angle of the second reference radiation onto the sensor and a difference between the azimuthal angle of the first reference radiation onto the sensor and each of an azimuthal angle of the first illumination radiation onto the structure and an azimuthal angle of the second illumination radiation onto the structure is 90±30 degrees, in the reference frame of the structure.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatuses may be generally referred to as lithographic tools. Such a lithographic tool may use vacuum conditions or ambient (non-vacuum) conditions.

Although specific reference is made to "metrology apparatus/tool/system" or "inspection apparatus/tool/system", these terms may refer to the same or similar types of tools, apparatuses or systems. E.g. the inspection or metrology apparatus that comprises an embodiment of the invention may be used to determine characteristics of structures on a substrate or on a wafer. E.g. the inspection apparatus or metrology apparatus that comprises an embodiment of the invention may be used to detect defects of a substrate or defects of structures on a substrate or on a wafer. In such an embodiment, a characteristic of interest of the structure on the substrate may relate to defects in the structure, the absence of a specific part of the structure, or the presence of an unwanted structure on the substrate or on the wafer.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

The invention claimed is:

1. A method of determining a characteristic of a structure manufactured on a substrate, comprising:
   illuminating the structure with first illumination radiation to generate first scattered radiation;
   detecting on a sensor a first interference pattern formed by interference between a portion of the first scattered radiation reaching the sensor and a first reference radiation;
   illuminating the structure with second illumination radiation, from a different direction with respect to the first illumination radiation in a reference frame of the structure, to generate second scattered radiation;
   detecting on the sensor a second interference pattern formed by interference between a portion of the second scattered radiation reaching the sensor and a second reference radiation; and
   using the first interference pattern and the second interference pattern to determine the characteristic of the structure;
   wherein a first azimuthal angle of the first reference radiation onto the sensor is different with respect to a second azimuthal angle of the second reference radiation onto the sensor, in the reference frame of the structure.

2. The method of claim 1, wherein the difference between the first and second azimuthal angles is 180±30 degrees.

3. The method of claim 1, wherein the difference between the first and second azimuthal angles is nominally 180 degrees in the reference frame of the structure.

4. The method of claim 1, wherein:
   a radiation beam is split to generate the first illumination radiation and the first reference radiation; and
   an optical path length between a point where the radiation beam is split and the sensor is set to be equal for each of the first illumination radiation and the first reference radiation.

5. The method of claim 1, wherein:
   a radiation beam is split to generate the second illumination radiation and the second reference radiation; and
   an optical path length between a point where the radiation beam is split and the sensor is set to be equal for each of the second illumination radiation and the second reference radiation.

6. The method of claim 1, wherein the portion of the first scattered radiation reaching the sensor excludes a specular reflection component of the first scattered radiation.

7. The method of claim 1, wherein the portion of the second scattered radiation reaching the sensor excludes a specular reflection component of the second scattered radiation.

8. The method of claim 1, wherein the portion of the first scattered radiation reaching the sensor consists at least predominantly of one or more non-zeroth order diffraction components scattered from the structure.

9. The method of claim 8, wherein the portion of the second scattered radiation reaching the sensor consists at least predominantly of one or more non-zeroth order diffraction components scattered from the structure, the one or more non-zeroth order diffraction components being opposite in sign to the one or more non-zeroth order diffraction components of the portion of the first scattered radiation reaching the sensor.

10. The method of claim 1, wherein the first azimuthal angle is oblique with respect to the second azimuthal angle.

11. The method of claim 1, further comprising adjusting a direction of the first reference radiation onto the sensor relative to a direction of the first illumination radiation onto the structure to reduce a variation of contrast with position in the first interference pattern.

12. The method of claim 11, further comprising adjusting an optical property of an optical system used to guide the portion of the first scattered radiation reaching the sensor from the structure to the sensor to reduce a variation of contrast with position in the first interference pattern.

13. The method of claim 1, wherein each of the first reference radiation and the second reference radiation is a plane wave or a spherical wave.

14. The method of claim 1, wherein:
   the portion of the first scattered radiation reaching the sensor is at least partially coherent at the sensor with the first reference radiation; and
   the portion of the second scattered radiation reaching the sensor is at least partially coherent at the sensor with the second reference radiation.

15. The method of claim 1, wherein the determination of the characteristic of the structure is based on a difference between the first interference pattern and the second interference pattern.

16. The method of claim 1, wherein the determination of the characteristic of the structure comprises calculating a complex field of radiation from each of the first interference pattern and the second interference pattern and using the calculated complex field of radiation from each of the first interference pattern and the second interference pattern to determine the characteristic of the structure.

17. The method of claim 1, wherein the characteristic of the structure comprises one or more of the following:
   overlay;
   an error indicative of an error in focus of radiation used in a lithographic process to manufacture the structure; and
   an error indicative of an error in radiation dose of radiation used in a lithographic process to manufacture the structure.

* * * * *